United States Patent [19]

Factor

[11] 4,282,606
[45] Aug. 4, 1981

[54] BROADCAST DELAY LINE

[75] Inventor: Richard Factor, New York, N.Y.

[73] Assignee: Eventide Clockworks, Inc., New York, N.Y.

[21] Appl. No.: 29,213

[22] Filed: Apr. 12, 1979

[51] Int. Cl.³ .............................................. H04H 7/04
[52] U.S. Cl. ............................. 455/620; 179/1 MN; 179/1 SW
[58] Field of Search ............ 179/1 MN, 1 SW; 360/7; 365/45, 221, 239; 455/620

[56] References Cited

U.S. PATENT DOCUMENTS

| 2,918,524 | 12/1959 | Hume | 360/7 |
|---|---|---|---|
| 3,538,265 | 11/1970 | Keeler | 360/7 |
| 3,645,539 | 2/1972 | Jenkins | 360/7 |
| 4,156,286 | 5/1979 | Connors | 365/45 |

Primary Examiner—Howard W. Britton
Attorney, Agent, or Firm—Orville N. Greene

[57] ABSTRACT

The disclosure relates to a digital delay line especially suitable for broadcasting live audio programs. The memory of the digital delay line is of sufficient extent to produce a delay of about 6 seconds or more. The device is provided with a Dump button whereby one who is monitoring the program can, upon hearing an obscenity or a libellous remark, press the Dump button and change the program to real time eliminating the libellous or obscene remark. The device is provided with means to return the program to the full delay time without any or without substantial glitches.

2 Claims, 9 Drawing Figures

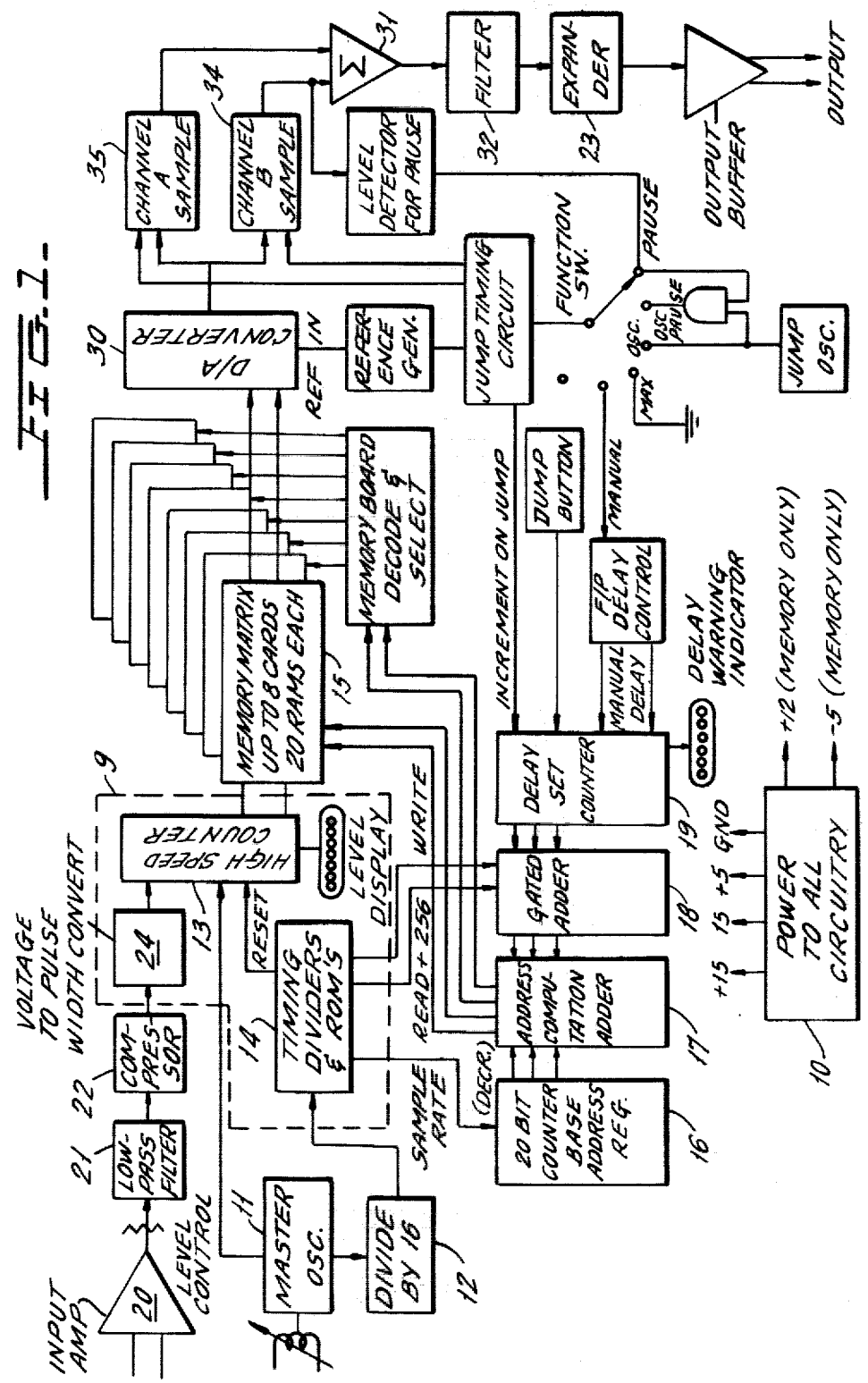

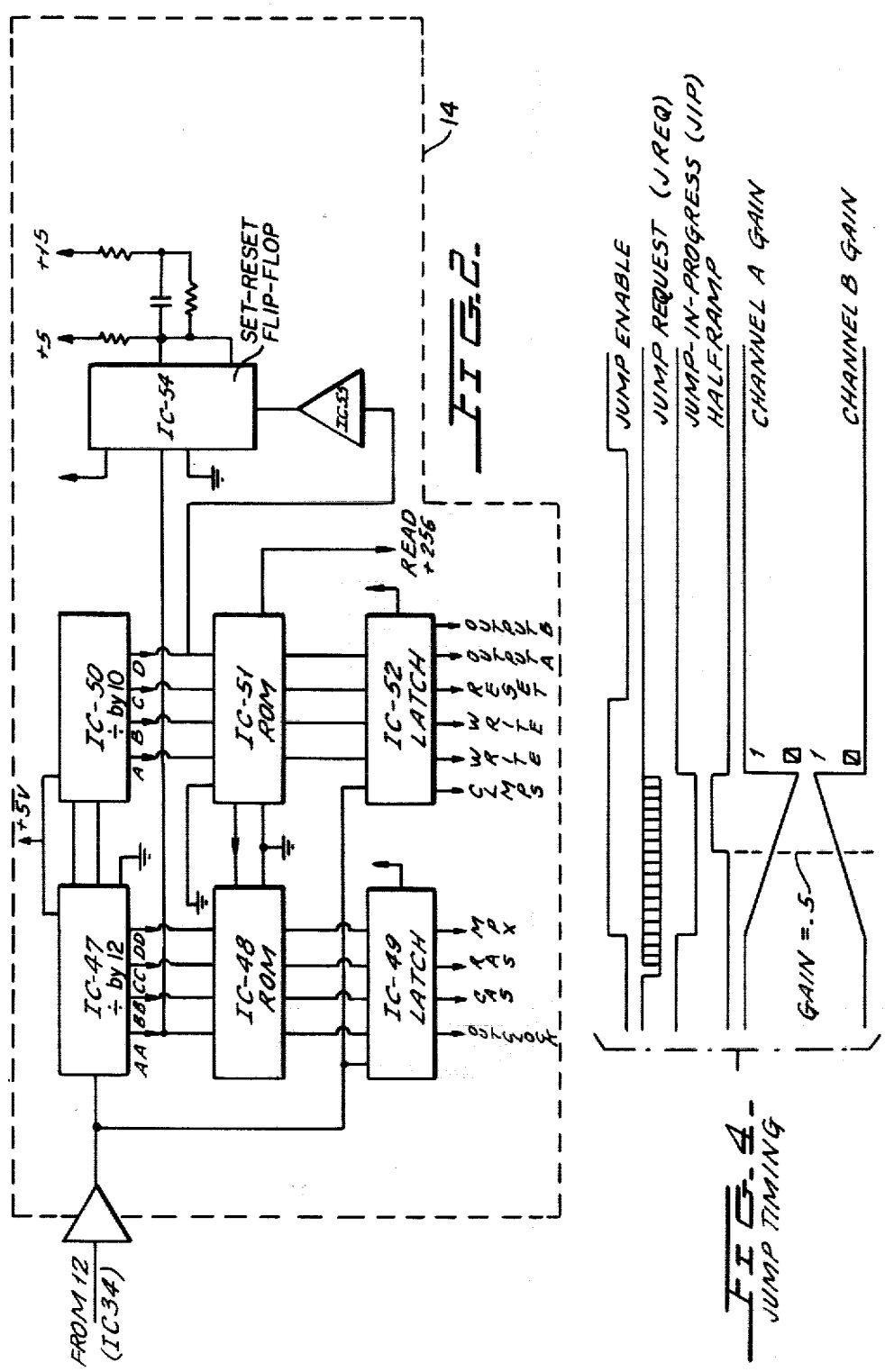

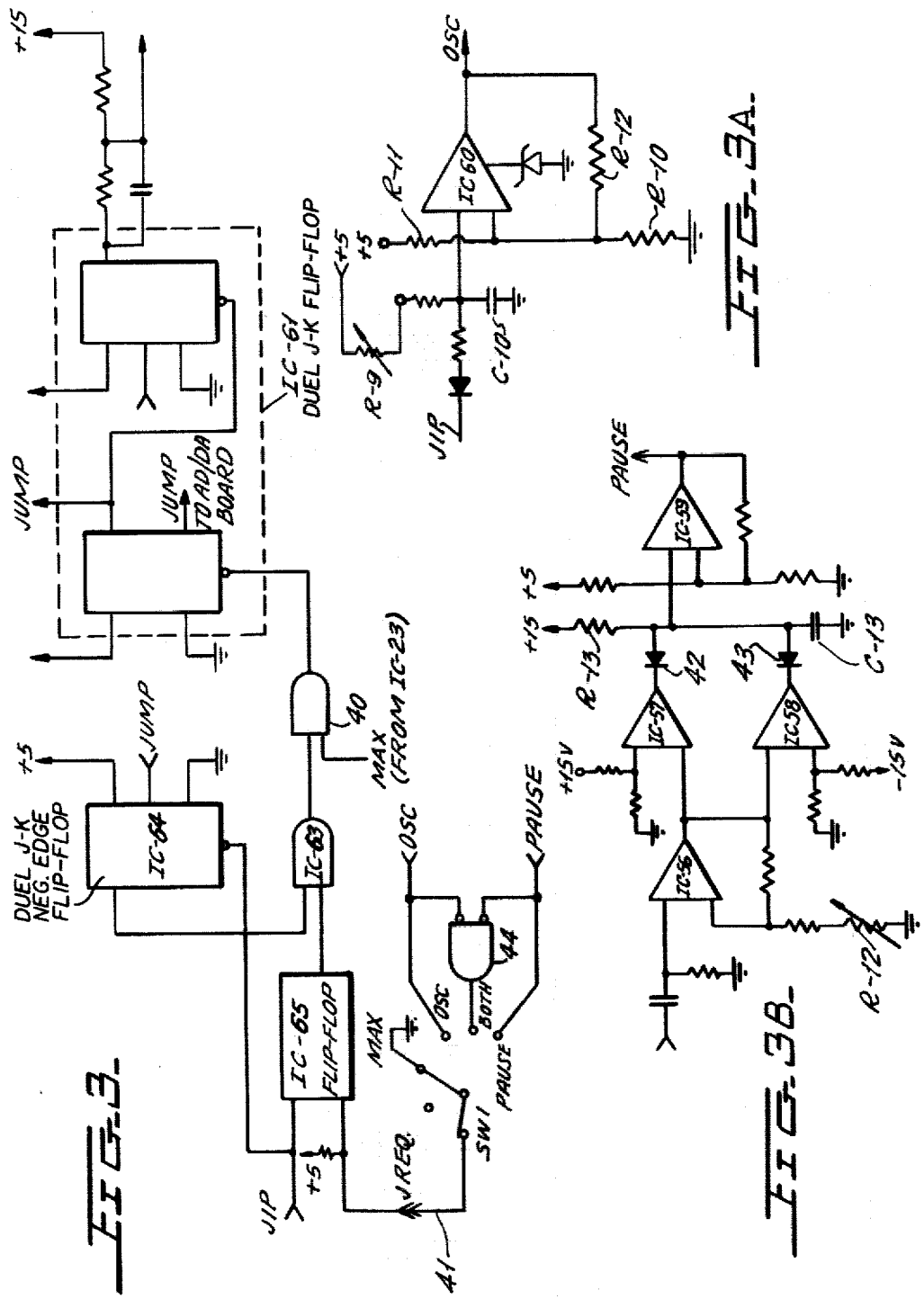

BROADCAST DELAY LINE

This invention relates to a broadcast delay line especially useful in the broadcasting of live programs.

The delay line of the invention is useful in the live broadcasting of radio programs wherein one or more words might be said which it is desirable to delete from the program because of obscene or libellous nature thereof. The delay line is also useful in production work to permit such effects as "doubling" or to provide echo effects. The unit also has television applications wherein a landline is employed to transmit audio program material which can be delayed to match the delay introduced in video signals when they are transmitted via satellite.

The most common way to eliminate obscene or libellous words from a radio broadcast, at the present time, is to prerecord the program on tape, then edit the tape by erasing or bleeping out the obscene or libellous words.

When operating live, with the aid of the present invention, the program sound is delayed, for example for up to about 6 or more seconds. When the announcer or director in charge of the apparatus hears an obscenity, he presses the "dump" button, whereupon the delay instantly goes to zero and the program continues in real time. The delay remains at zero as long as the "dump" button is held in. An internal delay is closed when the "dump" button is pressed and opens about ½ second after the button is released. As the program continues, the original safety delay margin is gradually restored to its maximum value, e.g. of 6 seconds, without pitch changes and without distortion.

The delay of the original signal to be broadcast is obtained, according to the invention, by sampling, quantizing, and coding, sample-and-hold techniques already recognized as an advantageous signal-handling technique. See "Digital Modulation for High-Quality Audio" by Sidney L. Silver in "DB" for June, 1978, pp. 33-38 and "Digital Voice Communication" by Sidney L. Silver in "Electronics World" vol. 84, No. 4, Oct. 1970, pp. 27-39, 78. Preferably, before being digitized, the signals are compressed and after the signals are recovered from a final D/A converter, the signals are then expanded to provide the original signal. By inclusion of the compression means and the subsequent expansion means, the dynamic range of the apparatus is increased.

In the process and apparatus of the invention, the random access memory (RAM), which is required to store the digital signals until withdrawn in succession to be fed to a D/A converter to regenerate the compressed analog signal, is made of sufficient capacity to store continuously sampled signals for a total of 6 seconds (or whatever maximum delay is desired). At the same time, means are provided to withdraw signals from the RAM substantially simultaneously with the time of their storage therein or at intervals of e.g. 8 milliseconds of time between real time and the maximum delay. To change a broadcast from delayed time to real time, a "dump" button is provided, and when the "dump" button is operated, the digital signals are withdrawn from the RAM without delay. A unique feature of the apparatus of the invention is its ability, slowly and almost inaudibly, to insert delay in the live program, which has been switched to real time, so that time may be caught up without putting extraneous material on the air. The key to this capacity is the ability of the RAM to look at various locations (delay times) upon instantaneous command. After each "dump" operation, "jump" commands are issued for the restoration of the delay. According to a feature of the invention, the delay time may be restored in any of several ways, (1) at a maximum rate, (2) at a rate slower than the maximum rate as determined by an oscillator, (3) at an indefinite rate wherein the pauses in the broadcast are detected and delay signals are inserted only during the pauses, and (4) at a combination of (2) and (3), wherein the pauses are used but the rate still proceeds within a definite period of time. Provision is also made for manually restoring the delay instantaneously. When restoring the delay time at the maximum rate, a catch-up command "jump" is issued (e.g., by a jump timing circuit), whereupon the output of the delay line is displaced a fraction of the total amount of delay for which the device is set, e.g., 256 samples, roughly 8 milliseconds, further from the input, thus increasing the delay by this amount. This must be done as unobtrusively as possible. If it were done the obvious way, by reading in data at one rate, and reading it out at another slower rate, pitch variation would result which would abruptly terminate when the maximum delay was reached. This is unacceptable. Accordingly, when the jump command is issued, a ramp generator is enabled which gradually decreases the amplitude of the real time signal and increases the amplitude of the delay signal. A second jump command is issued shortly after the initial real time signal is phased out and an additional delay of e.g., 256 samples is phased-in in the same way and the process repeated until the total delay time is restored.

Other features and advantages of the invention will be apparent from the following description of an embodiment thereof when considered in connection with the accompanying drawing wherein:

FIG. 1 is a block diagram of the device of the invention.

FIG. 2 is a detail diagram of the timing chain.

FIG. 3 is a more detailed block diagram of the "jump" or catch-up circuit.

FIG. 3A is a detailed diagram of the pause mode means for the catch-up circuit.

FIG. 3B is a detailed diagram of the oscillator mode means for the catch-up circuit.

FIG. 4 is a time chart illustrating the jump timing.

The power supply 10 generates the regulated D.C. voltages required by the remainder of the circuitry. The +12 volt supply is employed for the memory and the −5 volt, at very low current, is employed for bias for the memories in the illustrated embodiment of the invention. The 5 V is employed by the digital logic and, after filtering, as a bias supply for the analog circuitry. The + and −15 volt supplies are employed by the analog circuitry and output amplifiers.

Figure 2A:
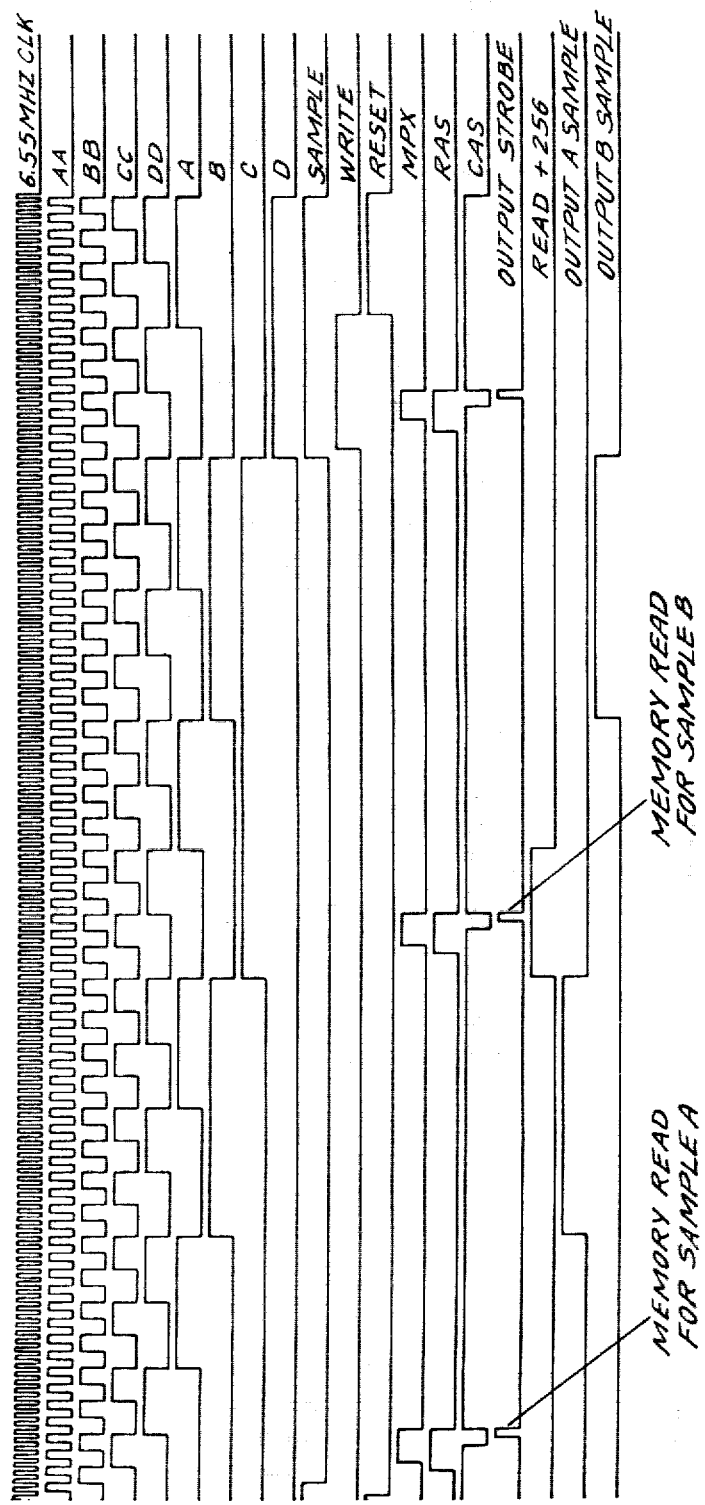
FIG. 2A is a time chart of the various parts of the FIG. 2.

A high speed oscillator 11 provides basic timing for the system and operates in the 100 MHz range. All clocks are derived from this signal by various dividers and counters. The output of oscillator 11 is applied to the divide-by-16 circuit 12 and to the input of the first counter 13 of the A/D converter. The output of divider 12 is connected to the synchronous timing generator indicated by box 14 and shown in detail in FIG. 2. The synchronous timing generator as shown in FIG. 2 includes IC-47 which divides the output of 12 by an additional factor of 16 and IC-50 which divides the output of IC-47 by 10. The outputs of these two integrated circuits, viz, A, B, C, D and AA, BB, CC, DD (shown in FIG. 2A) are decoded into unique time slots by read-only memories (ROM's, IC-48 and IC-51), so that events can be initiated at the proper time. The ROM's IC-48 and IC-51 are asynchronous and latches IC-49 and IC-52 are connected thereto to "deglitch" the output thereof IC-54 is a flip-flop synchronously set and reset IC-47 and IC-50 (synchronous timing generator). The period of flip flop IC-54 is a few tens of nanoseconds shorter than the maximum count of the A/D converter, and its output enables the A/D counter 13.

The analog to digital converter shown in dotted lines 9 in FIG. 1 changes the analog input signal into the bit patterns required for storage in the digital memory 15. This is accomplished by sampling the input signal at fixed intervals determined by the timing circuitry 14, measuring the voltage of the sample by means of counter 13, and writing the data word obtained from the counter into the memory 15 under control of the timing circuitry. (This process is analogous to that disclosed in said references cited above).

Preferably, prior to reaching the A/D converter, the input signal at amplifier 20 is conditioned by being passed through a low pass filter 21 and a compressor 22. The output signal will be expanded in a complementary fashion by expander 23. Compression and expansion of input and output signals, respectively, is known as companding (see U.S. Pat. No. 3,846,827, for example), and it increases the dynamic range of the digital delay line. The filtering by 21 decreases the amplitude of high frequency signals which could cause spurious responses from the delay line, known as "aliasing." The signal is also offset to +5 V DC by the network, represented by box 24, so that the converter which is inherently unipolar can convert AC signals.

Ignoring the intervening delay circuitry temporarily, the output comprises the digital to analog (D/A) converter 30 (FIG. 1) for changing the digital numbers removed from memory 15 back to an audio signal, the amplifier 31, the filter 32, and expander 23 already mentioned.

As already mentioned, a main feature of this invention relates to the provision for changing the output from a delay time of 6 seconds, for example, to real time and then recovering the delay time and this circuitry will now be described. Referring to FIG. 1, and the more detailed circuit of FIG. 5, IC-35 and IC-36 are 6-bit latches which are strobed when each word becomes available at the memory output. This data is applied to the input of the D/A converter IC-37. This converter is a special type called a "4-quadrant multiplying" D/A, which means that the output current or voltage (in this case current, converted to voltage by IC-41) is the product of the digital word and a reference voltage applied at point 77. Assume, for example, that the reference voltage is fixed at −10 v. As each word is input, it is converted from a current output to a voltage output by IC-41, an operational amplifier. The circuit constants are such that with a half scale digital input, the output voltage is 5 volts. As the digital input varies between 0 and full scale, the analog output varies between 0 and 30 10 v, so that the full scale signal amplitude is 10 v when the reference voltage is fixed at −10 v. (If the reference voltage at 77 is decreased, the offset remains the same (5 volts) but the full-scale amplitude decreases so that with a reference of 0, the output remains at 5 volts).

After the voltage is available at the output of IC-41, it is sampled at IC-43' and IC-43" which are analog switches identical to the one at the input sampler.

It will be noted, however, that memory 15 is read twice during each cycle and the output is latched in IC's 35 and 36. After each read operation, the data held in latches IC-35 and IC-36 is converted to analog form by IC-41. After the first read and digital to analog conversion, the analog signal is sampled by IC-43' and is called output A. After the second read and digital to analog conversion, the analog signal is sampled by IC-43" and is called output B. This sequence of events is depicted in the FIG. 2A timing diagram. These two samplings and the additional circuitry required for the second or B sample provide a unique feature of the device whereby, after the delayed program has been replaced by an undelayed portion of a program (to eliminate an obscene or libellous remark, for example), time may be caught up slowly and almost inaudibly. After such a "dump" has been accomplished, the delay time is caught up by a series of "jumps," the time length between jumps being controlled by a knob on the front panel, to insert the desired delay into the live program. The key to this capability is the ability of the RAM to look at various locations (delay time) upon instantaneous command. Each time a catch-up command "jump" is issued, the output of the B latch (IC-36) of the A/D converter is displaced, a suitable number of samples, e.g. 256 samples, roughly 8 milliseconds. A displacement of 256 samples has proved to be very satisfactory and the operation of the delay line will be described on the basis of such a displacement, although the time length of the jumps can be regulated to produce a larger or smaller displacement. Assume you are looking at a signal at time A, and you want to listen at time B, 8 milliseconds later, simply switching the times would cause an audible splice (equivalent to the splicing of a tape without an angled cut). One way to overcome the audible splice or "glitch" is to synthesize the digital equivalent of the 45° angle splice in a tape.

Figure 5:
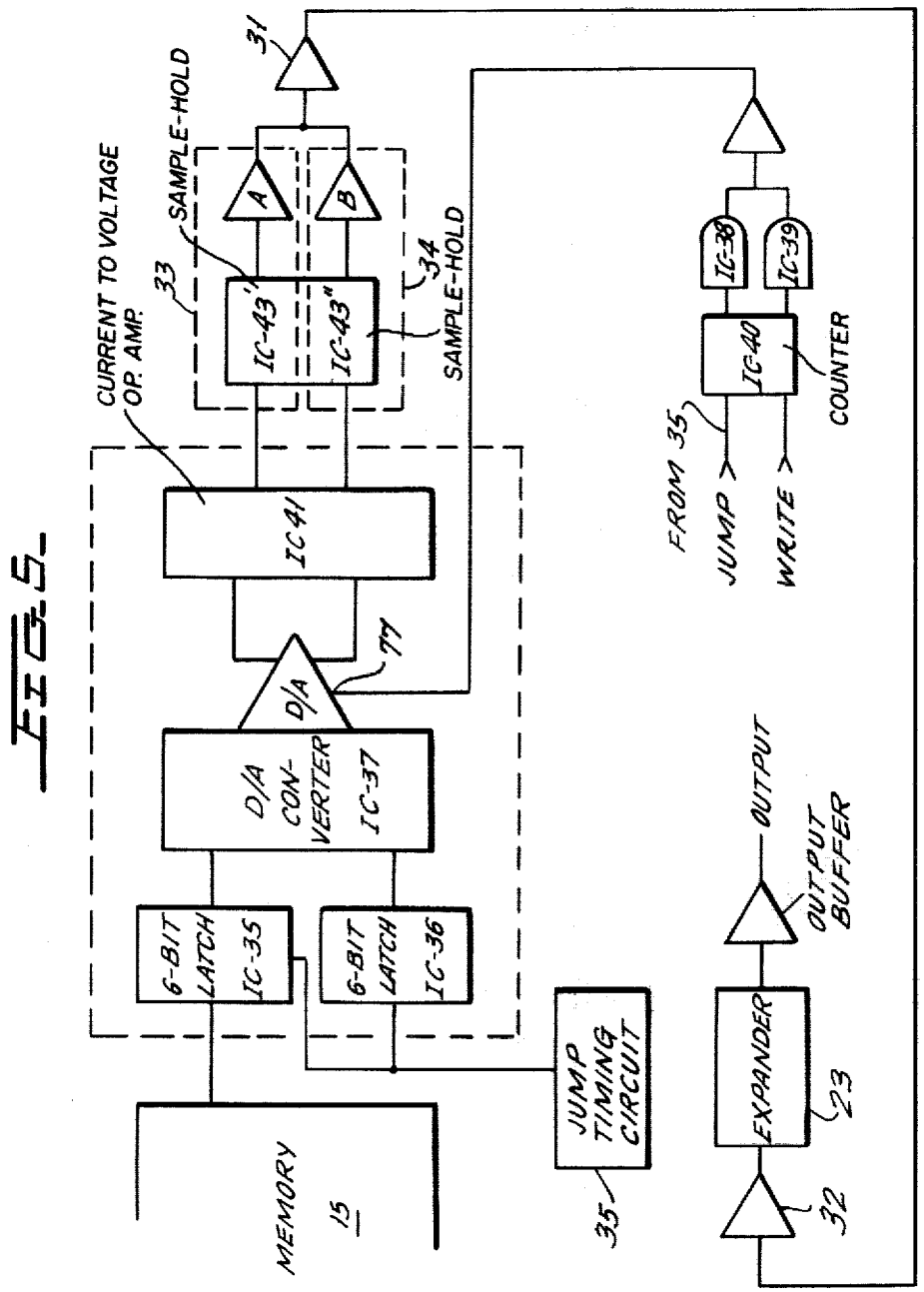
FIG. 5 is a detail block diagram of the output side of the device.

As shown in FIG. 5, the current value of the signal which is to be reproduced, is available in sample hold IC-43', whereas IC-43" holds a value 256 samples later. Normally, sample B is ignored by forcing the reference voltage at 77 to zero during the time that the B data is in the latch, IC 35–36. However, when a "jump" command is received, a counter IC-40 is enabled. This counter, in conjunction with exclusive OR gates, IC-38 and IC-39, forms a ramp generator which controls the reference voltage at 77. Normally, during sample A, the reference voltage is −10 v and 0 during sample B. As counter IC-40 increments, the A sample reference decreases in steps to 0 and the B sample reference increases in steps to −10 v. Each step of the ramp occupies one sample period, so that the transition is not abrupt. The outputs of both the A and B samples are combined in amplifier 31.

The effect of all this is that, when a jump command is received, the amplitude of the current signal is decreased and the amplitude of the delayed signal is simultaneously increased. Because of the method of generating the reference voltages, the sum of the two amplitudes is constant, thus providing a smooth transition (splice). At the end of the ramp interval, the counter IC-40 is instantaneously reset, the A output incremented by 256 samples and the B output disabled. Thus, the next sample (at full amplitude), is equivalent to what would have been the next B sample. The B output is meanwhile ready for another increment or jump.

As smooth as this transition is, it is not always inaudible. There will usually be some difference between the signals at the different times and this will show up as a combination of phase and amplitude modulation of the output signal. This is sometimes unavoidable, but there is one further precaution that can be taken: if the jump takes place during a period of no signal, then there will be no splice "glitch."

The major anticipated use for this unit is for changing the delay during speech programming. Speech is characterized by many pauses, both syllabic and deliberate, for thinking, effect, etc. By careful tailoring circuit time constants to these pauses, it is possible to increase delay during natural pauses in speech. Such "splices" are inaudible. The subjective effect, during catch-up, is that the speaker is talking a bit more slowly, but there is no pitch change and no distortion introduced.

Figure 6:
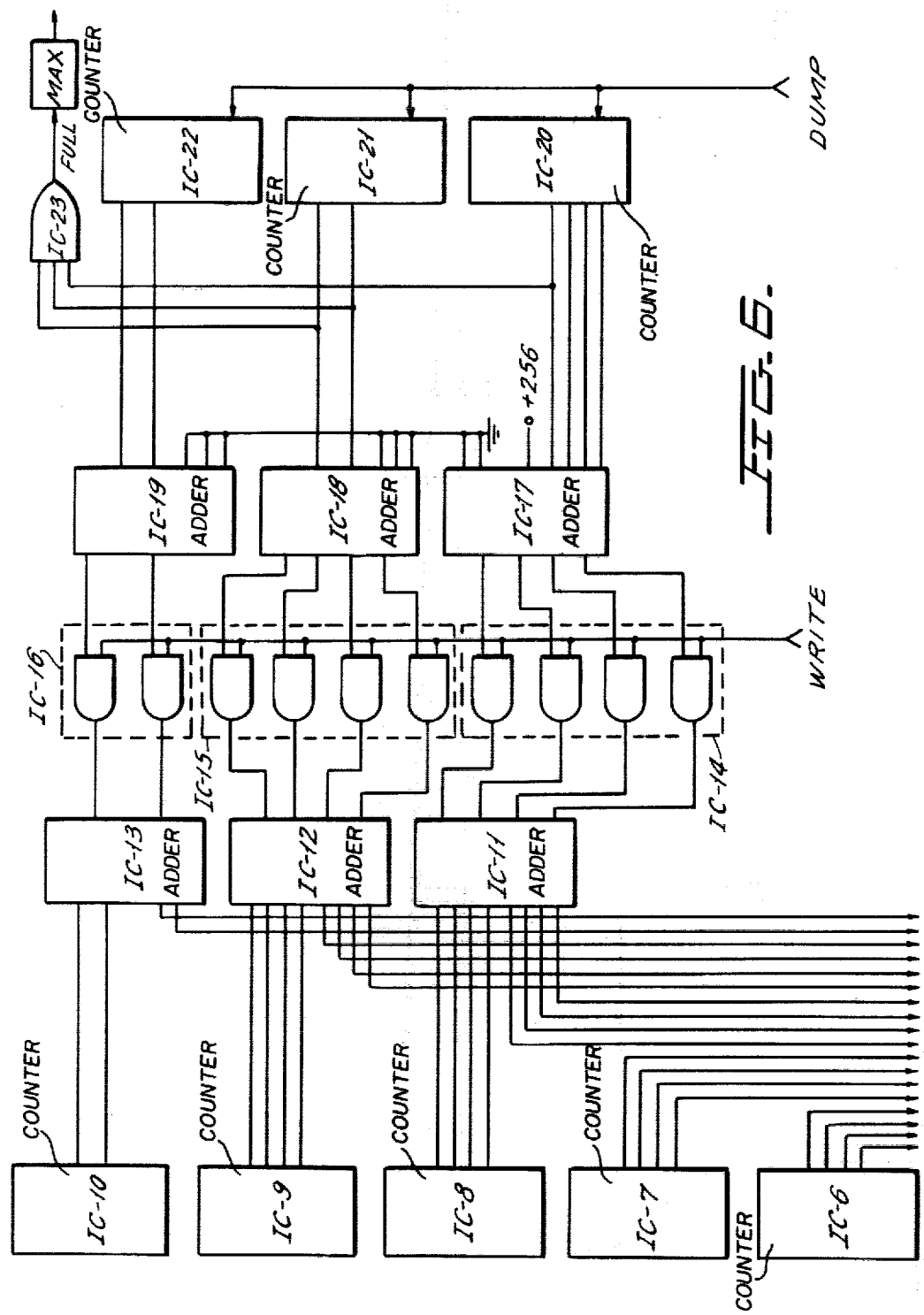
FIG. 6 shows the circuitry which controls the delay.

To utilize the pauses for delay requires additional logic because pauses occur asynchronously with the system timing. FIGS. 3, 3A and 3B illustrate how jump commands are issued as well as how the pause mode and other catch-up modes operate. The rotary, mode-select switch SW-1, which appears on the front panel, determines the catch-up mode to be applied. When a jump command (JREQ) is received, the enable S-R flip-flop IC-55, is set. Assuming that a jump has not occurred too recently, the request is passed through the quad 2-input AND gate, IC-63, to the quad 2-input NAND gate 40, which further qualifies the request when maximum delay has been reached as determined by NAND gate IC-23 (FIG. 6). If it has not, IC-61, a dual J-K flip-flop (with clear) is set which enables the B output strobe. When a jump begins, the enable flip-flop IC-64 (a dual J-K negative edge flip-flop), is reset. This prevents another jump from occurring too soon: if it is not done, the jumps could be continuous and the output would be cut down to zero (catch-up rate same as real time passage). The maximum rate is thus determined by the input pulses to IC-64. Transition of the most significant bit on the ramp generator signifies the end of the jump, which toggles IC-64 to permit the process to begin again at the first jump request thereafter.

When line 41 (JREQ) is grounded by SW-1 (Max. position), jumps are requested and occur as fast as they are enabled. A relaxation oscillator can make the catch-up rate slower. In the oscillator mode, the capacitor C-10 at the input of relaxation oscillator IC-60 (see FIG. 3A) is slowly charged through the variable resistance R-9, the resistance of which can be varied by the rate control knob of the front panel. When the capacitor reaches a threshold determined by the resistor network R-10, R-11 and R-12, the output OSC goes low issuing the request or command. The digital circuitry then discharges capacitor C-10 so that, after the jump, it must recharge before a new request can occur.

The jump on PAUSE circuit works as follows (see FIG. 3B): Operational amplifier IC-56 amplifies the A output only. The gain is controlled by a circuit board mounted trimpot R-12 (this adjustment can be changed to accommodate different talkers). Operational amplifiers IC-57 and IC-58 form a dual threshold comparator. If the output from IC-56 crosses either threshold, capacitor C-13 at the input of IC-59 is discharged through one of the diodes 42 or 43 pointing to the comparator input.

If there is a pause in the input signal, neither threshold is crossed and the capacitor charges through resistor R-13 connected to +15 v. When the capacitor voltage reaches the threshold of operational amplifier IC-59 (determined by the resistor network), a jump request is issued. In this case the capacitor C-13 is not discharged by the digital circuitry, and the pause will be taken advantage of e.g., for the full 8 milliseconds of a jump period.

The mode designated by "Both" is a logical OR (an AND gate 44 performing the OR function) which connects both the Pause and the Oscillator network to line 41. In this case, if a pause occurs, the oscillator remains inactive, but if no pause occurs, catch-up is forced by the oscillator.

Thus, in all cases, when the line 41 goes low, a jump request is initiated on the next jump ENABLE. If a jump request remains low, past the end of a jump-in-progress (JIP), an additional jump is initiated at the next jump ENABLE positive transition. FIG. 4 shows the timing of the jump process.

During a jump, the signal envelope is the sum of the signal multiplied by the channel A gain, and the signal delayed by 256 samples multiplied by the channel B gain. Because the signals may be in or out of phase (or in any phase relationship), the signal envelope may have two partial nulls or one full null during the jump. If the signal is not a sine wave or other repetitive signal, the effect will be hard to observe, but audible nevertheless, unless the PAUSE mode is in use.

FIG. 6 shows the circuitry which controls the delay. The various counters and adders of this figure determine the READ and WRITE addresses of the RAM which contains data corresponding to the input data stream in consecutive order.

IC-6 through IC-10 form a binary counter chain which is decremented every time a new word is written into RAM and constitute the BASE ADDRESS REGISTER. The five chips have a count capacity of 2 to the 20th power, or about 1 million counts. In a practical system where the maximum capacity of the delay line is ¼ of this, the top two bits are ignored. Depending upon the card complement 15, (FIG. 1) installed, fewer bits may be used. Each bit combination corresponds to one and only one address in the RAM array. The array shown uses 16K bit integrated circuits which have 2 to the 14th power storage locations. All chips get the bottom 14 bits applied to their address inputs. Each card contains two rows of 16K bits. The next bit selects the individual row on the memory card, and the remaining (up to 3) bits uniquely select the card.

Once the A/D converter has completed a conversion, the data is placed on the memory DATA input lines (as opposed to ADDRESS lines, determined by the counter). This data is written into the address location, and the counter is decremented. On the next write command, a data word is written into the next (lower) memory location. This continues until the entire memory is filled, at which point the first location is overwritten with new data. The procedure can be likened to recording on a tape loop: When a point comes around again, whatever is present is erased and a new signal is impressed on the tape.

This write operation is performed at the sampling rate of the digital delay line (DDL). Thus, each address corresponds to an input sample. Since the counter, e.g., the "BASE ADDRESS REGISTER" is decrementing, it can be seen that looking at an address positively offset from the base address register by a certain number of samples, will be the same sample input that number of sample periods earlier. Thus, reading data from the memory +1000 samples from the register, corresponds to a delay of 1000 sample periods (about 30 milliseconds).

The adders, (IC-11 through IC-13), accomplish this during READ operations. Note that one set of inputs to the adders is from the base address register (IC-6 through IC-10). The other is from a group of AND gates IC-14, IC-15, and IC-16, whose inputs in turn are enabled by "write." This means that the second input to the adders will always be 0 during write operations, forcing the write address to be equal to the base address. Refer to the read operations as READ A and READ B, depending upon the time during which they occur (and, of course, the use made of the data). During normal operation (no jump request), READ A is performed as follows: The counter chain IC-20 through IC-22 contains the fixed delay data. This passes through the group of adders formed by IC-17 through IC-19. Since all other inputs are grounded at this time, the adder output is identical to the adder input. Adders IC-17 through IC-19 feed their output through the AND gates (IC-14 to IC-16) to the first group of adders IC-11 to IC-13. Because the AND gates IC-14 to IC-16 are now enabled, the read address equals the sum of the base address and the delay setting counter IC-20 to IC-22.

Thus, the READ A operation retrieves data from the memory at the current delay setting of DDL as determined by IC-20 through IC-22.

The READ B operation is identical to READ A operation except that the +256 input of the adders IC-17 feeding the AND gate IC-11 is now enabled. The output of these adders is therefore the input (the current delay register) +256, giving the B delay required when summed with the base address register. These are the only memory reference operations which occur in the DDL. Although dynamic memories are used, there is effectively no refresh requirement because all accesses are unconditional and sequential, thus guaranteeing that all row addresses are read in the required length of time.

One additional mode of operation is controlled by the memory logic circuitry: The delay register/counter group may be manually set, in addition to being incremented after each jump request. The N MANUAL line activates the PRESET inputs of the counters allowing front panel control of the delay. The N FULL signal is provided to stop the delay counter from incrementing when the memory capacity of the unit is reached. N FULL is decided by selecting the inputs to IC-23 with a PC board mounted DIP switch. To indicate FULL, all inputs must be 1's. If the corresponding switch is open, the input will automatically be 1. If the switch is closed, the gate waits until that bit in the counter is true.

The memory array decoding is performed by address multiplexors (not shown) operating under the control of the timing ROM (IC-48 and IC-51) whose terminals RAS (Row Address Strobe) and CAS (column address strobe) shown in FIGS. 2 and 2A operate in the known key to strobe data into the RAM and enable the output buffers.

The one front panel control not discussed thus far is the "DUMP" switch (Panic button), see FIGS. 1 and 6. This switch initiates the procedure whereby the data in the memory is effectively removed from the on-air program stream. It works as follows: Assume that the unit is operating at maximum delay, and one desires to delete the program material in the memory. Pressing the DUMP switch instantly zeroes the delay register (IC-20 through IC-22) by the Dump Line shown in FIG. 6. The DDL is brought back into real time, and data presently stored in memory is overwritten before the delay can catch up to it again.

I claim:

1. A broadcasting delay line for delaying audible signals for up to several seconds or more, comprising an analogue to digital converter for sampling and converting audible signals to a digital number capable of being stored, a random access memory adapted to store a series of digital numbers corresponding to the longest delay period, means to retrieve said digital numbers in the order in which they were stored after a delay of up to several seconds, a digital to analogue converter adapted to convert the numbers retrieved from the random access memory to provide the original analog value, amplifier means to amplify the received analog signals and provide the output, manually controlled means adapted to switch the retrieval of signals stored in said memory from the said delay time to real time and means to switch the retrieval of signals stored in said memory back again to the delay time in a series of jumps, each of said jumps being a fraction of the total delay time.

2. A broadcasting delay line as claimed in claim 1 comprising means for detecting when a pause occurs during the broadcast, and means for executing a jump when a pause occurs whereby the broadcast during the jump becomes inaudible.

* * * * *